United States Patent [19]
Denham et al.

[11] Patent Number: 5,557,225
[45] Date of Patent: Sep. 17, 1996

[54] PULSED FLIP-FLOP CIRCUIT

[75] Inventors: Martin S. Denham, Yamhill; Keng L. Wong, Portland; Jeffrey E. Smith, Aloha; Roshan J. Fernando, Portland, all of Oreg.

[73] Assignee: Intel Corporation, Santa Clara, Calif.

[21] Appl. No.: 367,103

[22] Filed: Dec. 30, 1994

[51] Int. Cl.$^6$ .................................................. H03K 3/037
[52] U.S. Cl. ..................... 327/199; 327/218; 327/219; 327/172
[58] Field of Search .................. 327/199, 200, 327/202, 205, 215, 217, 212, 219, 218, 225, 172, 173

[56] References Cited

U.S. PATENT DOCUMENTS

| | | | |
|---|---|---|---|
| 3,610,964 | 10/1971 | Hatano | 327/200 |
| 4,893,028 | 1/1990 | Beltramini | 327/199 |
| 5,038,059 | 8/1991 | Ebzery et al. | 327/217 |
| 5,059,818 | 10/1991 | Witt et al. | 327/217 |
| 5,081,370 | 1/1992 | Bellin | 327/199 |
| 5,321,368 | 6/1994 | Hoelzle | 327/199 |

FOREIGN PATENT DOCUMENTS

| | | | |
|---|---|---|---|
| 63-65711 | 3/1988 | Japan | 327/218 |
| 2-205110 | 8/1990 | Japan | 327/218 |
| 5-110391 | 4/1993 | Japan | 327/218 |
| 6-104701 | 4/1994 | Japan | 327/215 |

*Primary Examiner*—Timothy P. Callahan
*Assistant Examiner*—My-Trang Nu Ton
*Attorney, Agent, or Firm*—Blakely, Sokoloff, Taylor & Zafman

[57] ABSTRACT

A flip-flop circuit is described. The flip-flop circuit receives the data signal from a data input, receives a trigger signal from a trigger input, generates a pulse signal in response to an edge in the trigger signal, and stores the data signal in response to the pulse. Alternatively, the flip-flop circuit receives a data signal through a data input, receives a trigger signal through a trigger input, stores the data signal in a latch, and suppresses the trigger signal to the latch when the data signal stored in the latch corresponds to the data signal received through the data input.

9 Claims, 7 Drawing Sheets

PULSED FLIP-FLOP CIRCUIT

FIELD OF THE INVENTION

The present invention relates to the field of electrical circuits. More particularly, the present invention relates to the design of flip-flop circuits.

BACKGROUND OF THE INVENTION

Flip-flop circuits are used in semiconductor devices to maintain a binary state until directed by an input signal to switch states. A variation of the basic flip-flop circuit, the clocked flip-flop circuit responds to input levels in response to a clock signal. Used in this manner, the clocked flip-flop circuit acts as a sampling device which only reads the information off of its input line when directed to do so by the clocking circuit. After reading the information, the circuit stores the information and outputs it on the output line. In all other instances of time, the circuit will not respond to input signals and will remain unchanged during variations of signal states on the input line.

Despite their usefulness, typical flip-flops have many shortcomings. One such typical flip-flop is the master-slave flip-flop. The master-slave flip-flop comprises two latches, a master latch and a slave latch. With the two latches, the master-slave flip-flop can be designed to be an edge triggered device, either positive edge triggered or negative edge triggered. The data signal provided to a master-slave flip-flop is transmitted through the master latch and through the slave latch. The master latch and the slave latch are coupled to a clock signal. The master latch stores the data signal when the clock signal is in a first signal state and the slave latch stores the signal from the master latch when the clock signal is in a second signal state. In this manner, the master-slave flip-flop samples and holds a data signal during a positive clock edge or a negative clock edge.

Although relatively slow, the prior master-slave flip-flops satisfied existing design requirements. In processor devices, master-slave flip-flops are used in registers. The speed of the registers in a processor along with the speed of associated combinatorial logic in the processor are both factors which determine the clock frequency at which the processor can operate at and thus, determines the performance capability of the processor. In prior processors, the combinatorial logic consumed the majority of clock cycle time. However, with newer architectures, combinatorial logic used in processors have experienced improvements in speed. As such, the percentage of the clock period attributable to combinatorial logic has decreased and the percentage of the clock period attributable to flip-flops has increased. Thus, because flip-flop delays account for a larger percentage of the clock period, it has become increasingly important to enhance the speed of flip-flops to enhance the overall performance of processors.

In addition, the prior master-slave flip-flop also consumed a relatively large amount of power. In the past, VLSI (Very Large Scale Integration) circuits (e.g. microprocessors) were relatively simple with fewer storage elements. However, as microprocessors and other VLSI circuits increase in complexity, the number of storage elements increase proportionately and thus, the number of flip-flops used also increases. With the increase in the number of flip-flops, the proportion of power consumption attributable to clocking of flip-flops also increases. As such, it has become increasingly important to reduce the power consumption of the flip-flops used in VLSI circuits such as a microprocessor. In this manner, power consumption of VLSI circuits can be reduced.

Thus, a flip-flop circuit is needed which has improved performance through greater speed. What is also needed is a flip-flop circuit that has reduced power consumption.

SUMMARY OF THE INVENTION

A novel flip-flop circuit is described. The flip-flop circuit comprises a trigger signal input for receiving a trigger signal, a data signal input for receiving a data signal, a pulse generator coupled to the trigger signal input for generating a pulse signal in response to an edge in the trigger signal, and a latch coupled to the pulse generator for receiving the data signal and storing the data signal in response to the pulse signal.

Under an alternative embodiment, the pulse generator comprises a latch and also comprises a feedback line from an output of the pulse generator to the latch of the pulse generator.

Under another alternative embodiment, the flip-flop circuit comprises a trigger signal input for receiving a trigger signal, a data signal input for receiving a data signal, a latch coupled to the data signal input for receiving the data signal and storing the data signal, and a trigger suppresser coupled to the trigger signal input for suppressing the trigger signal when the data signal received by the data signal input corresponds to the data signal stored by the latch.

Under yet another alternative embodiment, the trigger suppresser comprises a comparator coupled to the data signal input and the latch for comparing the data signal received by the data signal input and the data signal stored by the latch.

Under yet another alternative embodiment, the trigger suppresser comprises a gate for suppressing the trigger signal when the data signal received by the data signal input corresponds to the data signal stored by the latch.

A method for receiving and storing a data signal in a flip-flop circuit is also described. The method comprises receiving the data signal from a data input, receiving a trigger signal from a trigger input, generating a pulse signal in response to an edge in the trigger signal, and storing the data signal in response to the pulse.

Under an alternative embodiment, generating a pulse signal in response to an edge in the trigger signal comprises generating a delayed trigger signal, comparing the delayed trigger signal to the trigger signal to generate a rising edge of the pulse signal, and comparing the delayed trigger signal to the trigger signal to generate a falling edge of the pulse signal.

Under another alternative embodiment, generating a delayed trigger signal further comprises feeding back the pulse signal to a latch in a pulse generator generating the pulse.

Under yet another alternative embodiment, generating a pulse signal in response to an edge in the trigger signal further comprises feeding back the pulse signal to a reset input of the latch.

Under yet another alternative embodiment, the method comprises receiving a data signal through a data input, receiving a trigger signal through a trigger input, storing the data signal in a latch, comparing the data signal stored in the latch with the data signal received through the data input, and suppressing the trigger signal to the latch when the data signal stored in the latch corresponds to the data signal received through the data input.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A novel flip-flop is described. In the following detailed description, numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
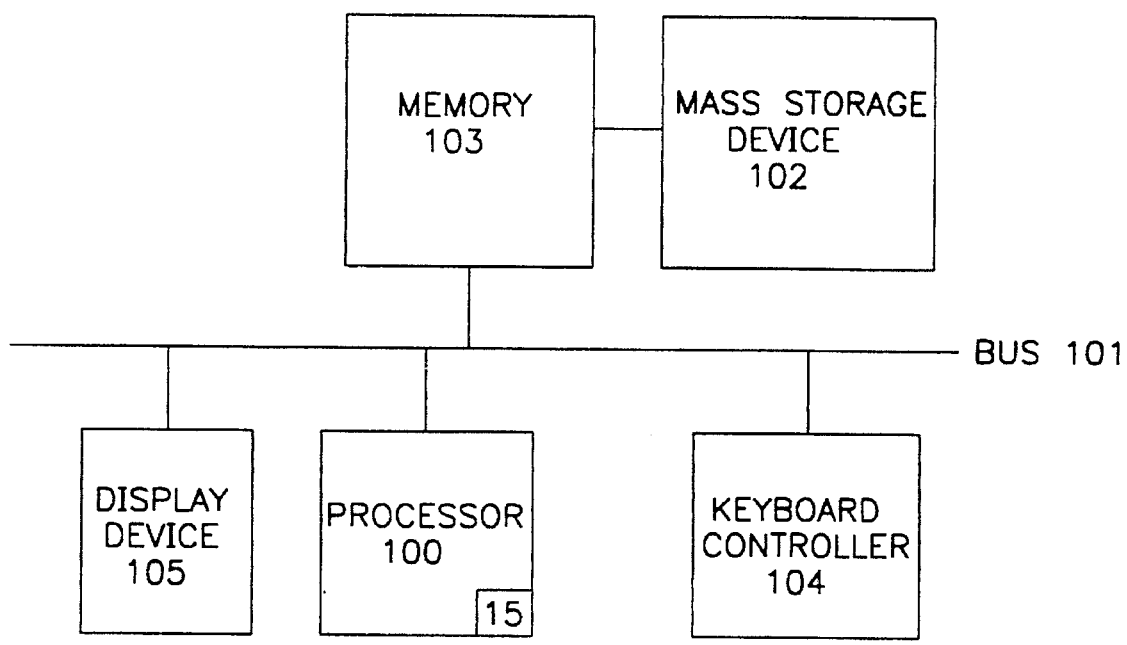
FIG. 1 illustrates in block diagram form a computer system of one embodiment of the present invention.

FIG. 1 illustrates in block diagram form a computer system of one embodiment of the present invention. Computer system 10 comprises processor 100, bus 101, mass storage device 102, memory 103, keyboard controller 104 and display device 105. Memory 103, keyboard controller 104 and display device 105 are coupled to bus 101 and bus 101 in turn is coupled to processor 100. In this manner, memory 103, keyboard controller 104 and display device 105 are in communication with processor 100. Moreover, processor 100 is in communication with memory 103, keyboard controller 104 and display device 105. Bus 101 can be a single bus or a combination of multiple buses. As an example, bus 101 can comprise an Industry Standard Architecture (ISA) bus, an Extended Industry Standard Architecture (EISA) bus, a system bus, a X-Bus, a PS/2 bus, a Peripheral Components Interconnect (PCI) bus, a Personal Computer Memory Card International Association (PCMCIA) bus or other buses. Bus 101 provides communication links between components in computer system 10. Mass storage device 102 can be a hard disk drive, a floppy disk drive, a CD-ROM device, a flash memory device or other storage device. Mass storage device 102 provides information to memory 103. Memory 103 can comprise a dynamic random access memory (DRAM) device, a static random access memory, (SRAM) device, a cache memory device or other memory devices. Memory 103 stores information from mass storage device 102 and processor 100 for use by processor 100. Keyboard controller 104 can be a dedicated device or can reside in another device such as a bus controller or other controller. Keyboard controller 104 allows coupling of a keyboard to computer system 10 and transmits signals from a keyboard to computer system 10. Display device 105 can be a television set, a computer monitor, a flat panel display or other display device. Display device 105 receives information from processor 100 and displays the information to the user of computer system 10.

Processor 100 can be a complex instruction set computing (CISC) microprocessor, reduced instruction set computing (RISC) microprocessor or other processor device. In FIG. 1, processor 100 comprises flip-flop circuit 15 for receiving and storing data signals. Flip-flop circuit 15 comprises a trigger signal input for receiving a trigger signal, a data signal input for receiving a data signal, a pulse generator coupled to the trigger signal input for generating a pulse signal in response to an edge in the trigger signal, and a latch for receiving the data signal and storing the data signal in response to the pulse signal. Alternatively, flip-flop circuit 15 comprises a trigger signal input for receiving a trigger signal, a data signal input for receiving a data signal, a latch coupled to the data signal input for receiving the data signal and storing the data signal, and a trigger suppresser coupled to the trigger signal input for suppressing the trigger signal when the data signal received by the data signal input corresponds to the data signal stored by the latch. The trigger signal can be a clock signal and the edge in the trigger signal can be a rising edge or can be a falling edge.

Figure 2:
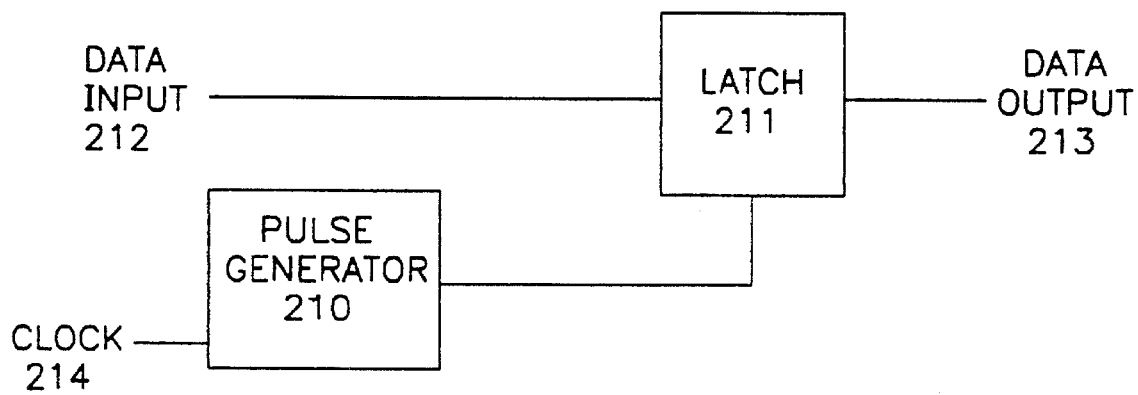
FIG. 2 illustrates in block diagram form a flip-flop circuit of a second embodiment of the present invention.

FIG. 2 illustrates in block diagram form a flip-flop circuit of a second embodiment of the present invention. Flip-flop circuit 20 comprises pulse generator 210, latch 211, data input 212, data output 213 and clock input 214. Pulse generator 210 is coupled to clock input 214 and is also coupled to latch 211. Pulse generator 210 receives a clock signal through clock input 214. When a rising edge appears in the clock signal, pulse generator 210 generates a pulse signal to latch 211 in response to the rising edge in the clock signal. When a falling edge appears in the clock signal, pulse generator does not generate a pulse signal to latch 211. Latch 211 is coupled to data input 212 and data output 213. Normally, latch 211 is not responsive to data signals appearing on data input 212. However, when latch 211 receives a pulse signal from pulse generator 210, latch 211 propagates the data signal appearing on data input 212 during the duration of the pulse signal. At the trailing edge, latch 211 retains the data signal. Latch 211 also transmits the data signal to data output 213 and continues to transmit the data signal until latch 211 receives the next pulse signal from pulse generator 210. When latch 211 receives the next pulse signal from pulse generator 210 as a result of a rising edge in the clock signal, latch 211 propagates a new data signal appearing on data input 212 during the duration of the new pulse signal and transmits the new data signal to data output 213.

Because pulse generator 210 only generates a pulse signal to latch 211 when a rising edge appears in the clock signal, latch 211 only retains and transmits the data signal appearing on data input 212 when a rising edge appears in the dock signal. Thus, flip-flop circuit 20 is an edge triggered device. Moreover, flip-flop circuit 20 is also faster when compared to the prior masterslave flip-flop circuit. In achieving faster performance, one manner that can be used is to reduce the time required for a flip-flop circuit to output a new data signal after receiving the new data signal. The time required can in turn be reduced by reducing the quantity of gates and the associated gate delays encountered by the data signal in propagating from the input to the output of a flip-flop circuit.

In flip-flop circuit 20, only one latch, latch 211 is between data input 212 and data output 213. When a rising edge appears in the clock signal, the data signal appearing on data input 212 only has to propagate through one latch, latch 211 to reach data output 213. Compared with the prior master-slave flip-flop circuit, flip-flop circuit 20 is considerably faster because in the prior master-slave flip-flop circuit, the data signal has to propagate through two latches, a master latch and a slave latch. The data signal in the prior master-slave flip-flop thus encounters additional gates and gate delays associated with the additional latch not encountered by flip-flop circuit 20.

Under an alternative embodiment, pulse generator 210 generates a pulse signal to latch 211 in response to the falling edge in the clock signal instead of the rising edge in the clock signal. In response to the pulse signal, latch 211 stores the data signal appearing on data input 212 during the duration of the pulse signal. Latch 211 also transmits the stored data signal to data output 213 and continues to transmit the stored data signal until latch 211 receives the next pulse signal from pulse generator 210.

Figure 3:
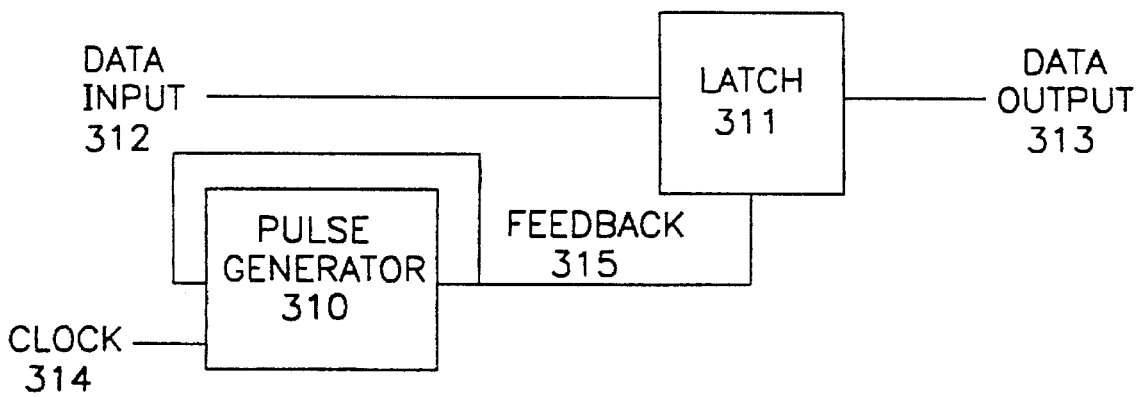
FIG. 3 illustrates in block diagram form a flip-flop circuit of a third embodiment of the present invention.

FIG. 3 illustrates in block diagram form a flip-flop circuit of a third embodiment of the present invention. Flip-flop circuit 30 comprises pulse generator 310, latch 311, data input 312, data output 313, clock input 314 and feedback 315. Pulse generator 310 is coupled to clock input 314, feed back 315 and latch 311. Latch 311 is coupled to data input 312 and data output 313. Pulse generator 310, latch 311, data input 312, data output 313, and clock input 314 operate similarly to pulse generator 210, latch 211, data input 212, data output 213 and dock input 214 of FIG. 2. Feedback 315 is coupled to an output of pulse generator 310 on one end and is coupled to the first input of pulse generator 310 on the other end. Feedback 315 transmits the pulse signal appearing at the output of pulse generator 310 back to the first input of pulse generator 310. When pulse generator 310 receives a rising edge of the clock signal through the second input, pulse generator 310 outputs a rising edge. Because the rising edge of the pulse signal appears at the output of pulse generator 310, the rising edge of the pulse signal is transmitted back to the first input of pulse generator 310 through feedback 315. When pulse generator 310 receives the rising edge of the pulse signal through the first input, pulse generator 310 generates the falling edge of the pulse signal. In this manner, pulse generator 310 generates a rising edge and a falling edge, thus forming a pulse signal.

Figure 4:
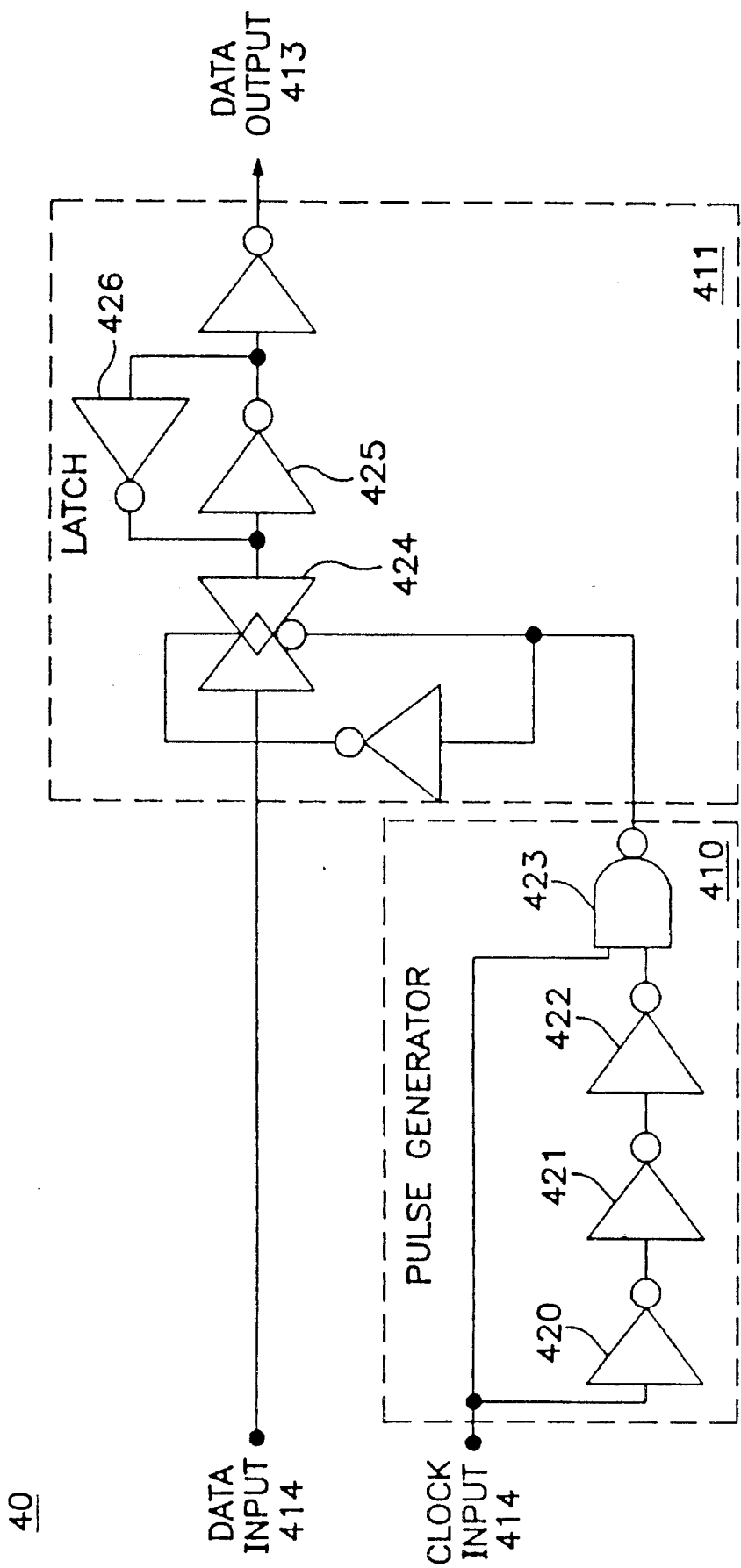
FIG. 4 illustrates in logic diagram form a flip-flop circuit of a fourth embodiment of the present invention.

FIG. 4 illustrates in logic diagram form a flip-flop circuit of a fourth embodiment of the present invention. Flip-flop circuit 40 comprises pulse generator 410, latch 411, data input 412, data output 413 and clock input 414. Pulse generator 410 is coupled to clock input 414 and latch 411. Latch 411 is coupled to data input 412 and data output 413. Pulse generator 410 comprises inverter 420, inverter 421, inverter 422 and NAND gate 423. Inverter 420 is coupled to clock input 414 and inverter 421. Inverter 421 is coupled to inverter 422 and inverter is coupled to NAND gate 423. Pulse generator 410 receives a clock signal through clock input 414. The clock signal is provided as an input to NAND gate 423. NAND gate 423 acts as enable logic. Other suitable circuitry can also be used. In addition, the clock signal is transmitted through inverter 420, inverter 421 and inverter 422. Inverter 420 and inverter 421 act to delay the dock signal. Inverter 422 inverts and delays the clock signal. The delayed and inverted dock signal is also provided as an input to NAND gate 423. When pulse generator 410 receives a rising edge in the clock signal, the rising edge is transmitted directly to one input of NAND gate 423. The other input of NAND gate 423 receives a delayed and inverted rising edge and thus, NAND gate 423 outputs a falling edge. When NAND gate 423 receives the delayed and inverted rising clock edge, NAND gate 423 outputs a rising edge. In this manner, the falling edge followed by the rising edge form a pulse signal which is transmitted to latch 411.

Latch 411 comprises pass gate 424, inverter 425 and inverter 426. Pass gate 424 is coupled to NAND gate 423 of pulse generator 410 and is also coupled to inverter 425 and inverter 426. Inverter 425 is coupled to inverter 426 and data output 413. Inverter 426 is also coupled to data output 426. Inverter 425 and inverter 426 are positioned back-to-back and performed the storage function of latch 411. When pass gate 424 receives the rising edge of the pulse signal from pulse generator 410, pass gate 424 opens and allows the data signal appearing at data input 412 to propagate through to inverter 425. Inverter 425 and inverter 426 store the data signal propagating through pass gate 424 and transmit the data signal to data output 413. When pass gate 424 receives the falling edge of the pulse signal, pass gate 424 closes and the data signal appearing at data input 412 no longer propagates through to inverter 425. Inverter 425 and inverter 426 continue to store the last data signal propagating through pass gate 424 and continue to transmit the last data signal to data output 413. When pass gate 424 opens again in response to a subsequent rising edge of the pulse signal, inverter 425 and inverter 426 store a new data signal appearing at data input 412. In this manner, the pulse signal generated by pulse generator 410 causes latch 411 to store a data signal appearing at data input 412. Pulse generator 410 can also be used in place of pulse generator 210 in FIG. 2.

Latch 411 may include other suitable circuitry. For example, the passgate and inverters may be replaced with D-type flip-flops or other suitable latching or sample-and-hold storage circuitry, for example. Additionally, the logic gates may include bipolar gates, CML/ECL gates, CMOS gates, or other suitable logic circuit technology. Latch 411 can be a passgate latch, multiplexor latch, NAND-NAND latch, NOR-NOR latch, tristate latch or other suitable latch.

Flip-flop circuit 40 though, is susceptible to processing variations associated with the process of fabricating transistors. The processing variations manifests itself in some transistors with lower transconductance and some transistors with higher transconductance. When higher transconductance occurs in the transistors that make up inverter 420, inverter 421 and inverter 422, the inverters switch faster and outputs the delayed clock signal to NAND gate 423 earlier. The earlier output of the delayed clock signal also leads to the early arrival of the delayed rising edge at NAND gate 423. Since the rising edge of the clock signal does not arrive any earlier to NAND gate 423, the early arrival of the delayed clock edge results in a pulse signal from NAND gate 423 that has a smaller pulse width. In extreme situations of processing variations, the pulse width may not be large enough to allow latch 411 sufficient time to store the data signal from data input 412. In more extreme situations of processing variations, the pulse height may not be sufficient to open pass gate 424.

Figure 5:
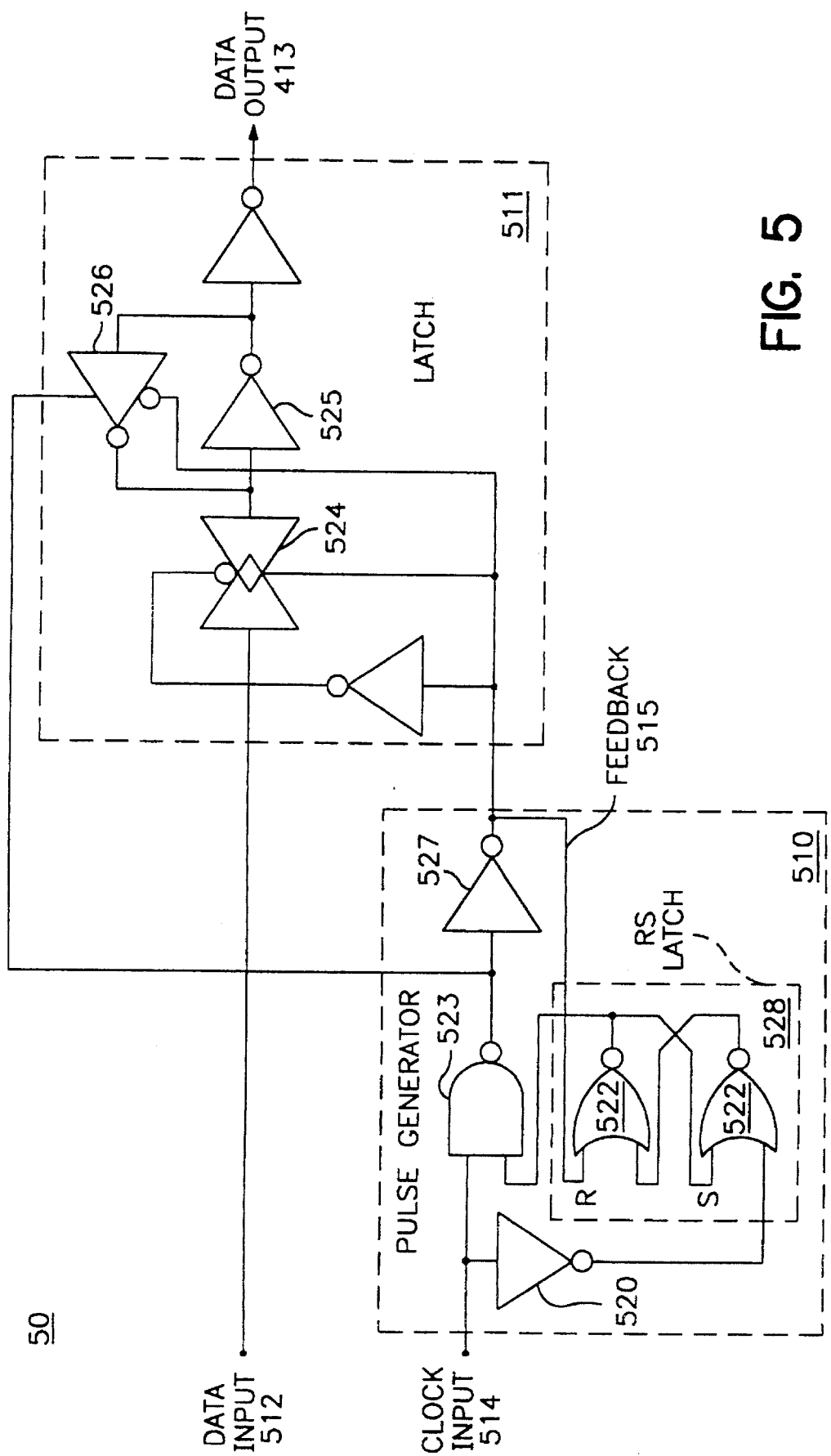
FIG. 5 illustrates in logic diagram form a flip-flop circuit of a fifth embodiment of the present invention.

FIG. 5 illustrates in logic diagram form a flip-flop circuit of a fifth embodiment of the present invention. Flip-flop circuit 50 comprises pulse generator 510, latch 511, data input 512, data output 513 and clock input 514. Pulse generator 510 generates a pulse signal in response to a rising edge in the clock signal received through clock input 514. The pulse signal is transmitted to latch 511. Pulse generator 510 comprises feedback 515, inverter 520, NAND gate 523, inverter 527 and latch 528. Latch 528 further comprises NOR gate 521 and NOR gate 522. Latch 528 in this embodiment is a reset-set latch. When pulse generator 510 receives a rising edge of the clock signal through clock input 514, the rising edge is transmitted to inverter 520 and NAND gate 523. Because the rising edge transmitted to inverter 520 has to propagate through NOR gate 521, the rising edge transmitted to inverter 520 does not change the output of NOR gate 522 and NAND gate 523 receives a rising edge at one input only. As a result, NAND gate 523 initially transmits a falling edge in response to a rising edge of the clock signal at clock input 514. The falling edge is transmitted through inverter 527 and becomes the output of pulse generator 510 as a rising edge. The rising edge is transmitted by feedback 515 back to the R input of latch 528. In response to the rising edge at the R input, latch 528 outputs a falling edge to NAND gate 523. NAND gate 523 outputs a rising edge to inverter 527 which becomes a falling edge at the output of generator 510. The rising edge at the output of pulse generator 510 followed by the falling edge at the output of pulse generator 510 forms the pulse signal generated by pulse generator 510. The pulse signal generated by pulse generator 510 is transmitted to latch 511. In this manner, NAND gate 523 acts as enable logic. Other suitable circuitry can also be used in place of NAND gate 423.

In this embodiment, feedback 515 is coupled to the output of pulse generator 510 and the reset input of pulse generator 510. It will be appreciated that instead of the output of pulse generator 510, feedback 515 can be coupled to latch 511. For example, feedback 515 can be coupled to passgate 524 or tristate buffer 526 along with an inverter if appropriate.

Latch 511 comprises pass gate 524, inverter 525 and tri-state buffer 526. Latch 511 operates similarly to latch 411 of FIG. 4 except that tri-state buffer 526 reduces the contention associated with back-to-back inverters. When latch 511 receives a pulse signal from pulse generator 510, tri-state buffer 526 acts as an open circuit. In this manner, tri-state buffer 526 does not "fight" the new data signal propagating through pass-gate 524. When pulse generator 510 no longer transmits a pulse signal to latch 511, tri-state buffer 526 acts as an inverter and in conjunction with inverter 525 performs the storage function of latch 511. Pulse generator 510 can also be used in place of pulse generator 310 in FIG. 3.

Latch 528 may include other suitable circuitry. For example, the reset-set latch may be replaced with D-type flip-flops or other suitable latching or sample-and-hold storage circuitry, for example. Additionally, the logic gates may include bipolar gates, CML/ECL gates, CMOS gates, or other suitable logic circuit technology. Latch 528 can be a passgate latch, multiplexor latch, NAND-NAND latch, NOR-NOR latch, tristate latch or other suitable latch.

Under an alternative embodiment, pulse generator 510 generates a pulse signal to latch 511 in response to the falling edge in the clock signal instead of the rising edge in the clock signal. In response to the pulse signal, latch 511 stores the data signal appearing on data input 512 during the duration of the pulse signal. Latch 511 also transmits the stored data signal to data output 513 and continues to transmit the stored data signal until latch 511 receives the next pulse signal from pulse generator 510.

Unlike flip-flop circuit 40 of FIG. 4, flip-flop circuit 50 is not as susceptible to channel-length variations. In flip-flop circuit 50, the rising edge of the pulse signal is generated when the rising edge of the clock signal propagates through NAND gate 523 and inverter 527. The falling edge of the pulse signal is generated when the rising edge of the pulse signal is transmitted through NOR gate 522, NAND gate 523 and inverter 527. Consequently, channel-length variations in transistors that make up NAND gate 523 and inverter 527 do not affect the pulse width of the pulse signal because both the rising edge of the pulse signal and the falling edge of the pulse signal rely on signal propagation through NAND gate 523 and inverter 527. Any earliness in the falling edge of the pulse signal due to channel-length variations in NAND gate 523 or inverter 527 is compensated by earliness in the rising edge of the pulse signal. Thus, in flip-flop circuit 50, only channel-length variations in one device, NOR gate 522, affect the pulse width of the pulse signal. In comparison, as described above, channel-length variations in any one of three devices of flip-flop 40, inverter 420, inverter 421 and inverter 422, can affect the pulse width of the pulse signal. As such, flip-flop 50 is less susceptible to channel-length variations.

In addition, flip-flop 50 is less susceptible to channel-length variations because pulse generator 510 transmits a falling edge after receiving a rising edge through feedback 515. In flip-flop 40 of FIG. 4 where the falling edge is generated independently of the rising edge, a "late" or "slow rising" rising edge caused by channel-length variations can result in a pulse signal with a small pulse width or small pulse height especially if accompanied by an "early" or "fast rising" delayed rising edge caused also by channel-length variations. In extreme situations of channel-length variation, the pulse width may not be large enough to allow latch 411 sufficient time to store the data signal from data input 412. In more extreme situations of channel-length variations, the pulse height may not be sufficient to open pass gate 424. Flip-flop 50 on the other hand, "waits" for the rising edge to be transmitted through feedback 515 before generating the falling edge. Thus, a "late" or "slow rising" rising edge is accompanied by a "late" falling edge. In this manner, proper pulse width and pulse height is maintained and the effects of channel-length variations are mitigated.

Figure 6:
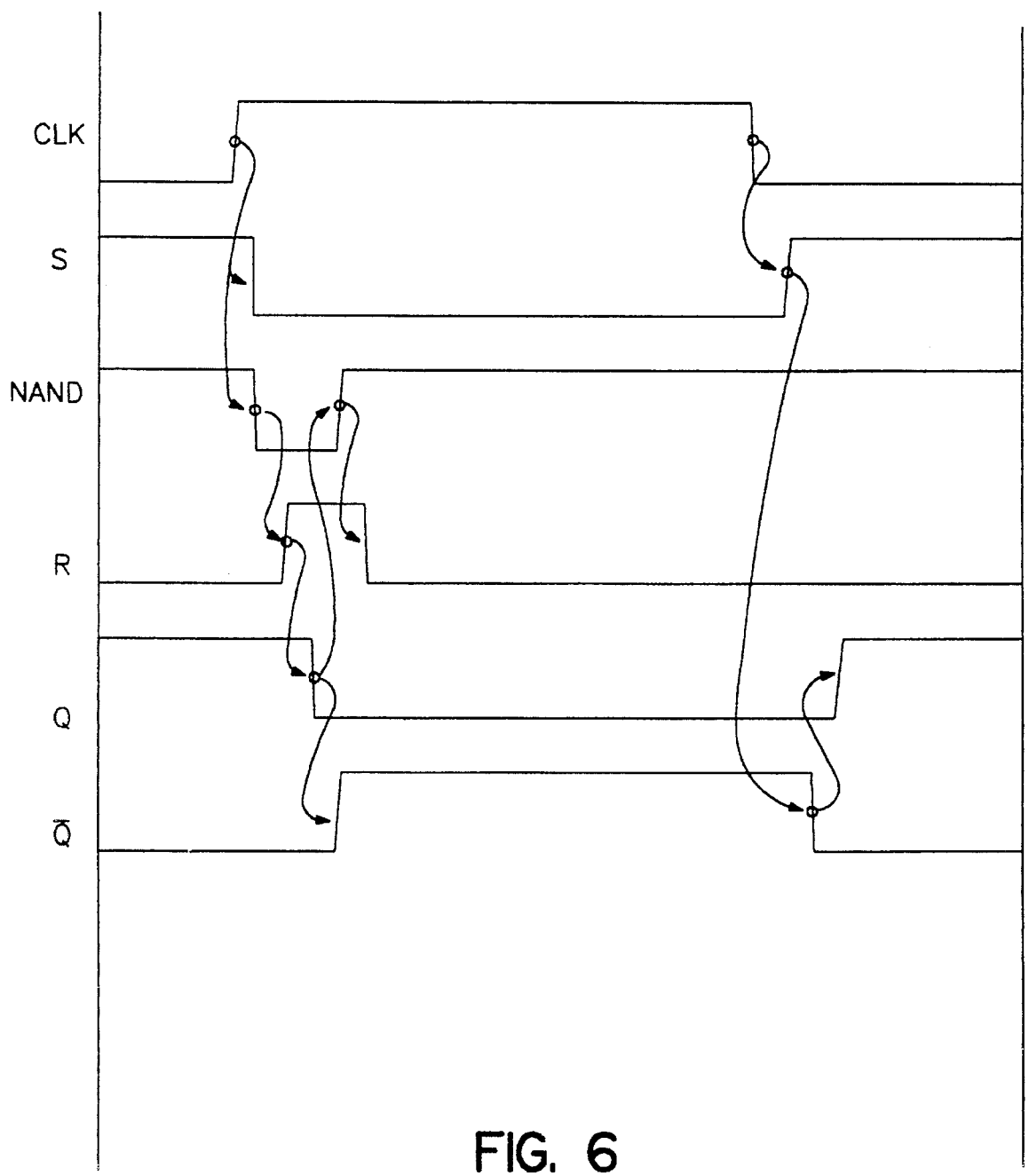
FIG. 6 illustrates in timing diagram form the operation of the pulse generator of FIG. 5.

FIG. 6 illustrates in timing diagram form the operation of the pulse generator of FIG. 5. Waveform CLK represents the clock signal appearing at clock input 514. Waveform CLK also represents the input signal to inverter 520 and one of the input signals to NAND gate 523. Waveform R represents the input signal appearing at the R input of latch 528 and the output of inverter 527. Waveform R also represents the feedback signal. Waveform S represents the input signal appearing at S input of latch 528 and the output signal of inverter 520. Waveform Q represents the output signal appearing at the Q output of latch 528 and also one of the input signals to NAND gate 523. Waveform $\overline{Q}$ represents the output signal from NOR gate 521 and one of the input signals to NOR gate 522. Waveform NAND represents the output signal of NAND gate 523 and also the input signal to inverter 527.

When the clock signal is in a first signal state e.g. logical-zero, inverter 527 outputs a first signal state to R input of latch 528 (Waveform R). Inverter 520 outputs a second signal state e.g. "1" to S input of latch 528 (Waveform S). Latch 528 also outputs a second signal state to one of the inputs of NAND gate 523 (Waveform Q). NOR gate 521 outputs a first signal state to one of the inputs of NOR gate 522 (Waveform $\overline{Q}$). NAND gate 523 outputs a second signal state to inverter 527 (Waveform NAND). When the clock signal transitions to the second signal state, inverter 520 outputs the first signal state (Waveform S) and NAND gate 523 also outputs the first signal state (Waveform NAND) after a short time period attributable to gate delays. In response to the output of NAND gate 523, inverter 527 outputs a second signal state (Waveform R). The signal state from inverter 527 is transmitted to latch 511 and is also transmitted back to the R input of latch 528 through feedback 515. In response to the output from inverter 527, NOR gate 522 outputs a first signal state which is also the output of latch 528 (Waveform Q). The output of NOR gate 522 is transmitted to NAND gate 523 and NOR gate 521. In response to the output from NOR gate 522, NOR gate 521 outputs a second signal state (Waveform $\overline{Q}$) and NAND gate 523 also outputs a second signal state (Waveform NAND). As described above, the output of NAND gate 523 is transmitted to inverter 527. In response to the output of NAND gate 523, inverter 527 outputs a first signal state (Waveform R). As illustrated by waveform R, inverter 527 transitions from a first signal state to a second signal state and from a second signal state back to a first signal state in response to a transition in the clock signal from a first signal state to a second signal state. In this manner, inverter 527 and consequently, pulse generator 510 generates a pulse signal that is transmitted to latch 511.

After the pulse signal is generated by pulse generator 510, waveforms R, S, Q $\overline{Q}$ and NAND remain in their respective existing signal states until the clock signal transition from a second signal state back to a first signal state. When the clock signal transitions from a second signal state to a first signal state, inverter 520 outputs a second signal state in response to a first signal state from clock input 514. NOR gate 521 outputs a first signal state in response to the output from inverter 520. NOR gate 522 outputs a second signal state in response to the output from NOR gate 521. NAND gate 523 remains unaffected by the transition in the clock signal from the second signal state to the first signal state and continues to output a second signal state. Consequently, inverter 527 also remains unaffected by the transition in the clock signal from the second signal state to the first signal state and continues to output a first signal state. Because inverter 527 is not affected by a transition in the clock signal from the second signal state to the first signal state, no pulse signal is generated. As such, pulse generator 510 does not generate a pulse signal when the clock signal transitions from the second signal state to a first signal state (during the falling edge of the clock signal).

With the individual components operating in the manner described above, inverter 527 outputs a delayed and inverted version of the pulse signal from NAND gate 523 (Waveform R). Inverter 520 outputs a delayed and inverted version of the clock signal (Waveform S). NOR gate 522 also outputs a delayed and inverted version of the clock signal. However, the signal from NOR gate 522 is more delayed than the signal from inverter 520 (Waveform Q). NOR gate 521 outputs a signal that is a logical-one when both inverter 520 and NOR gate 522 output a signal that is a logical-zero. NAND gate 523 outputs a negative pulse signal (falling edge followed by rising edge) in response to a rising edge in the clock signal. The falling edge of the negative pulse signal is produced by the rising edge of the clock signal. The rising edge of the negative pulse signal is produced by a falling edge generated by NOR gate 522 when NOR gate 522 outputs a delayed and inverted version of the clock signal.

Figure 7:
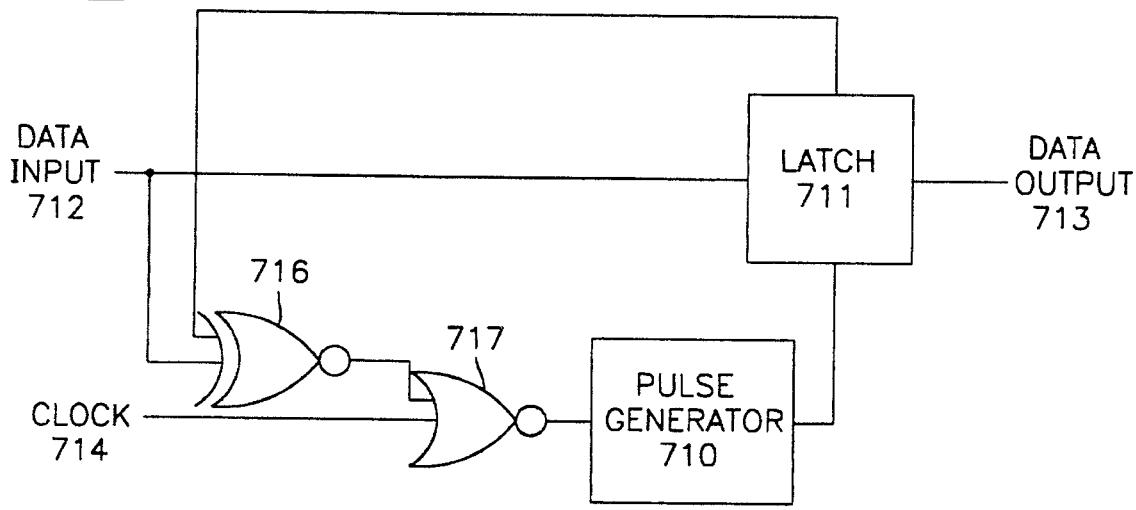
FIG. 7 illustrates in block diagram form a flip-flop circuit of a sixth embodiment of the present invention.

FIG. 7 illustrates in block diagram form a flip-flop circuit of a sixth embodiment of the present invention. Flip-flop circuit 70 comprises pulse generator 710, latch 711, data input 712, data output 713, clock input 714, exclusive-NOR gate 716 and NOR gate 717. The first input of exclusive-NOR gate 716 is coupled to latch 711 and the second input of exclusive-NOR gate 716 is coupled to data input 712. Exclusive-NOR gate 716 acts as a comparator and compares the signal state stored in latch 711 with the signal state appearing at data input 712. When the signal state stored in latch 711 does not correspond to the signal state appearing at data input 712, exclusive-NOR gate 716 outputs a first signal state e.g. logical-zero. On the other hand, when the signal state stored in latch 711 corresponds to the signal state appearing at data input 712, exclusive-NOR gate 716 outputs a second signal state e.g. logical-one. The output of exclusive-NOR gate 716 is provided as the first input to NOR gate 717. NOR gate 717 is coupled to clock input 714 through the second input. NOR gate 717 acts as a clock suppressor suppressing the clock signal from clock input 714 when NOR gate 717 receives a second signal state from exclusive NOR gate 716. When NOR gate 717 receives a first signal state from exclusive-NOR gate 716, NOR gate 717 outputs the inversion of the clock signal received. The inverted clock signal is transmitted by NOR gate 717 to pulse generator 710. In this manner, exclusive-NOR gate 716 compares the signal state stored in latch 711 with the signal state appearing at data input 712 and in conjunction with NOR gate 717 suppresses the clock signal from clock input 714 when the signal state stored in latch 711 corresponds to the signal state appearing at data input 712.

Figure 8:
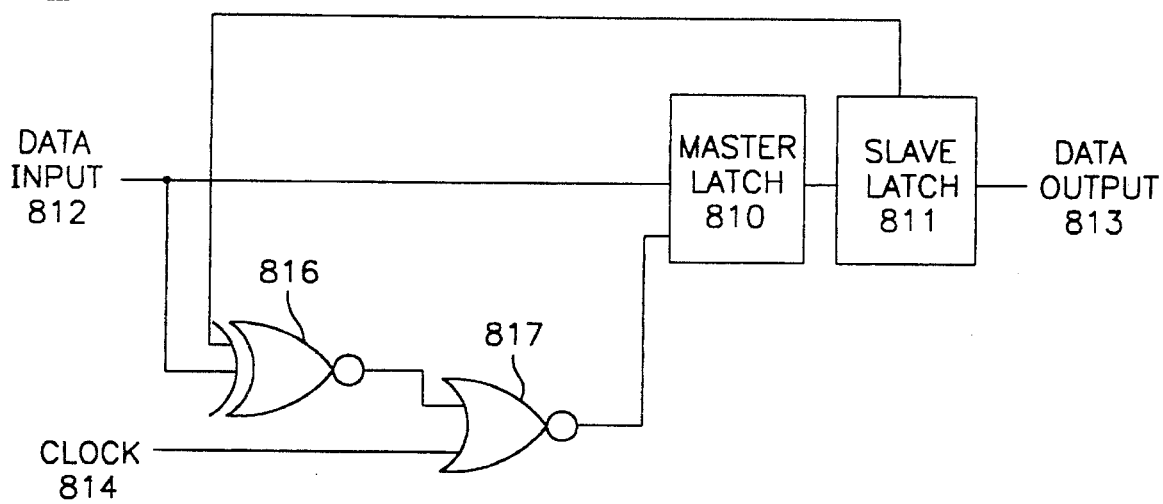
FIG. 8 illustrates in block diagram form a flip-flop circuit of a seventh embodiment of the present invention.

FIG. 8 illustrates in block diagram form a flip-flop circuit of a seventh embodiment of the present invention. Flip-flop circuit 80 comprises of master latch 810, slave latch 811, data input 812, data output 813, clock input 814, exclusive-NOR gate 816 and NOR gate 817. In flip-flop circuit 80, both master latch 810 and slave latch 811 are coupled to clock input 814 and receive the clock signal. Exclusive-NOR gate 816 and NOR gate 817 operate similarly to exclusive-NOR gate 716 and NOR gate 717 of FIG. 7. When the signal state stored in slave latch 811 corresponds to the signal state appearing at data input 812, the clock signal is suppressed by exclusive-NOR gate 816 in conjunction with NOR gate 817.

Figure 9:
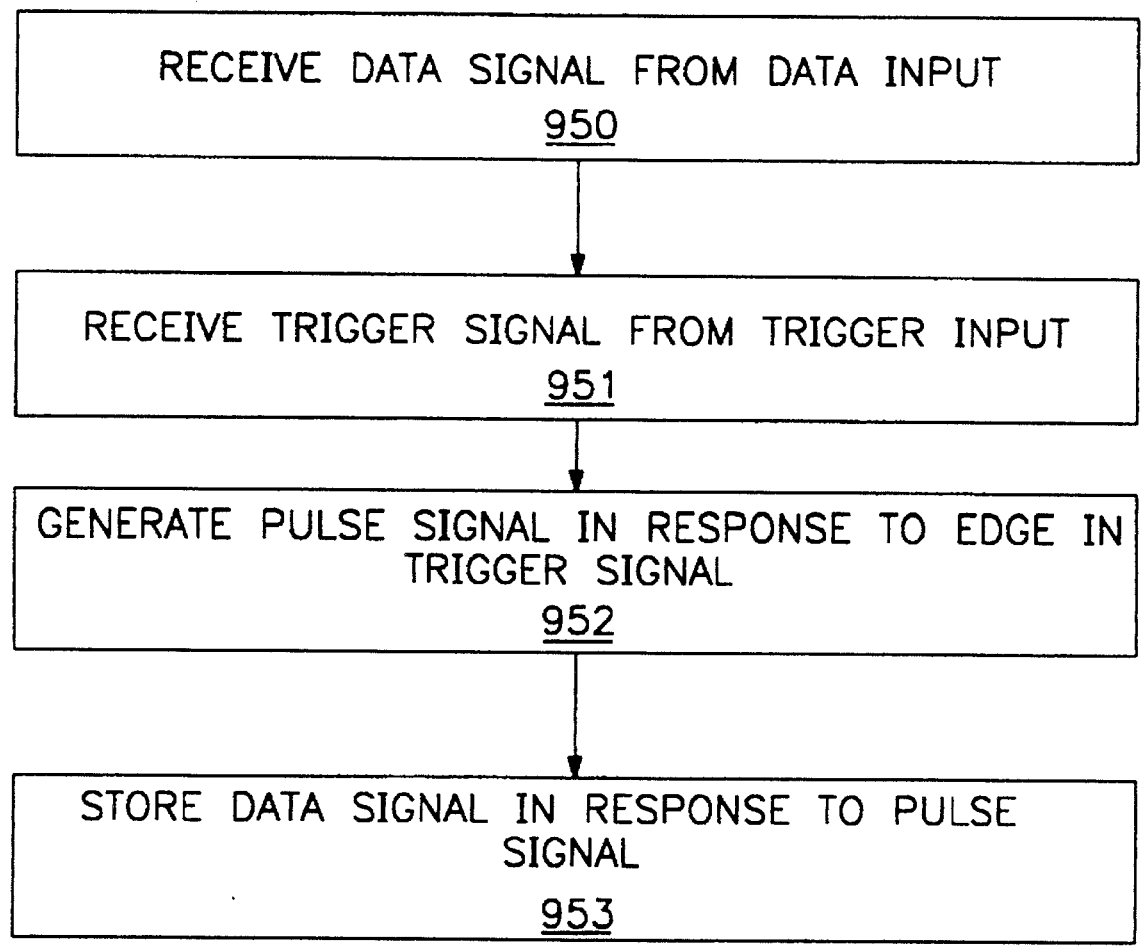
FIG. 9 illustrates in flow chart diagram form the operation of a flip-flop circuit of an eighth embodiment of the present invention.

FIG. 9 illustrates in flow chart diagram form the operation of a flip-flop circuit of an eighth embodiment of the present invention. The flip-flop circuit receives a data signal from a data input as shown in block 950. The flip-flop circuit also receives a trigger signal from a trigger input as shown in block 951. The flip-flop circuit generates a pulse signal in response to an edge in the trigger signal as shown in block 952. The pulse signal can be generated by generating a delayed trigger signal, comparing the delay trigger signal to the trigger signal to generate a rising edge of the pulse signal and comparing the delayed trigger signal to the trigger signal to generate a falling edge of the pulse signal. Alternatively, the pulse signal can also be generated by providing the trigger signal to a set input of a latch and comparing the output of the latch to the trigger signal. The flip-flop circuit stores the data signal in response to the pulse signal as shown in block 953. The data signal can be stored by latching the data signal in response to the pulse or alternatively, by opening a pass gate in response to the pulse signal and transmitting the data signal to a storage circuit.

In the foregoing description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims, which in themselves recite only those features regarded as essential to the invention.

Thus, a method and apparatus for receiving and storing data signals has been described.

What is claimed is:

1. A flip-flop circuit comprising:
    a trigger signal input for receiving a trigger signal;
    a data signal input for receiving a data signal;
    a pulse generator coupled to the trigger signal for generating a pulse signal in response to a first edge in the trigger signal, the pulse generator comprising a first latch and a feedback line from an output of the pulse generator, the first latch coupled to the feedback line and the trigger signal, the pulse generator generating the pulse signal by comparing the trigger signal with an output of the first latch such that the pulse signal is generated in response to only the first edge; and
    a second latch coupled to said pulse generator and the data signal input for receiving the data signal and storing said data signal in response to said pulse signal.

2. The flip-flop circuit described in claim 1 wherein the second latch further comprises:
    a pass gate coupled to the data input signal and the pulse generator, the pass gate propagating the data signal in response to the pulse signal;
    a storage device coupled to the pass gate to receive and store the data signal.

3. The flip-flop circuit described in claim 2 wherein the storage device comprises a first inverter coupled to receive input from the pass gate and a tri-state buffer coupled to receive input from the first inverter, the first inverter coupled to receiver input from an output of the tri-state buffer, the tri-state buffer acting as an open circuit in response to the pulse signal.

4. The flip-flop circuit described in claim 1 wherein the first edge of the trigger signal is a rising edge.

5. The flip-flop circuit described in claim 1 wherein the first edge of the trigger signal is a falling edge.

6. A flip-flop circuit comprising:
    a trigger signal input, the trigger signal input receiving a trigger signal;
    a data signal input, the data signal input receiving a data signal;
    a latch coupled to the data signal input, the latch receiving the data signal and storing said data signal in response to a pulse signal;
    a trigger suppresser circuit coupled to the trigger signal having a first logic gate and a second logic gate, the trigger suppresser circuit suppressing the latch from receiving the pulse signal in response to the data signal and an output of the latch, the first logic gate coupled to receive input from the data signal and the output of the latch, the second logic gate coupled to receive an output of the first logic gate and the trigger signal, the latch coupled to receive an output of the second logic gate: and
    a pulse generator coupled between the trigger suppresser circuit and the latch the pulse generator generating a pulse signal in response to a first edge in the trigger signal.

7. The flip-flop circuit described in claim 6 wherein the trigger signal is a clock signal.

8. The flip-flop circuit described in claim 7 wherein the trigger suppresser circuit suppresses the pulse generator from receiving the trigger signal when the output of the latch corresponds with the data signal.

9. The flip-flop circuit described in claim 8 wherein the first logic gate is a logical-exclusive-NOR gate and the second logic gate as a logical-NOR gate.

\* \* \* \* \*

UNITED STATES PATENT AND TRADEMARK OFFICE
CERTIFICATE OF CORRECTION

PATENT NO. : 5,557,225
DATED : September 17, 1996
INVENTOR(S) : Denham et al.

It is certified that error appears in the above-indentified patent and that said Letters Patent is hereby corrected as shown below:

In column 1 at line 14 delete "docked" and insert --clocked--

In column 5 at line 20 delete "dock" and insert --clock--

In column 5 at line 61 delete "dock" and insert --clock--

In column 6 at line 26 delete "dock" and insert --clock--

In column 6 at line 27 delete "dock" and insert --clock--

In column 9 at line 32 delete "transrnitted" and insert --transmitted--

In column 10 at line 63 delete "dock" and insert --clock--

Signed and Sealed this

First Day of April, 1997

*Attest:*

BRUCE LEHMAN

*Attesting Officer*     Commissioner of Patents and Trademarks